(12) United States Patent
Sandhu et al.

(10) Patent No.: US 9,882,576 B1
(45) Date of Patent: Jan. 30, 2018

(54) ANALOG TO DIGITAL CONVERTER USING CORRELATED ELECTRON MATERIAL DEVICES

(71) Applicant: ARM Limited, Cambridge (GB)

(72) Inventors: Bal S. Sandhu, Fremont, CA (US); Piyush Agarwal, Noida (IN); Akshay Kumar, New Delhi (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/398,142

(22) Filed: Jan. 4, 2017

(51) Int. Cl.
  H03M 1/78 (2006.01)
  H03M 1/12 (2006.01)
  H03M 1/38 (2006.01)

(52) U.S. Cl.
  CPC .......... H03M 1/1245 (2013.01); H03M 1/38 (2013.01)

(58) Field of Classification Search
  CPC ........ H03M 1/46; H03M 1/765; H03M 1/468; H03M 1/14; H03M 1/12; H03M 1/20; H03M 1/38; H03M 1/34; H03M 1/662
  USPC .......................... 341/144, 145, 155, 161, 165
  See application file for complete search history.

(56) References Cited

U.S. PATENT DOCUMENTS

| | | | | |
|---|---|---|---|---|
| 3,108,266 A | 10/1963 | Gordon et al. | | |
| 6,529,152 B1 * | 3/2003 | Piasecki | ................ | H03M 1/682 341/136 |
| 6,738,284 B2 * | 5/2004 | Torok | ................ | H03M 7/004 324/252 |
| 6,844,840 B1 * | 1/2005 | Melanson | ............... | H03M 1/46 341/155 |
| 6,944,048 B2 * | 9/2005 | Iwata | ...................... | G11C 11/15 365/158 |
| 7,714,764 B2 * | 5/2010 | Houng | ................. | H03M 1/361 341/155 |
| 8,681,033 B2 * | 3/2014 | Marukame | .......... | H03M 1/1061 341/155 |
| 2002/0180431 A1 * | 12/2002 | Torok | ................. | G01R 33/09 324/252 |
| 2003/0184460 A1 * | 10/2003 | Johnson | ................... | H03K 5/24 341/133 |
| 2009/0309776 A1 * | 12/2009 | Inoue | .................... | H03M 1/687 341/145 |
| 2012/0262315 A1 * | 10/2012 | Kapusta | ................ | H03M 1/125 341/110 |
| 2017/0045905 A1 | 2/2017 | Sandhu et al. | | |
| 2017/0047919 A1 * | 2/2017 | Sandhu | ............. | G11C 13/0069 |

* cited by examiner

*Primary Examiner* — Linh Nguyen
(74) *Attorney, Agent, or Firm* — Leveque IP Law, P.C.

(57) ABSTRACT

An analog-to-digital converter (ADC) and method of operation thereof are provided for converting an analog signal to a digital signal. The ADC utilizes Correlated Electron Material (CEM) devices that may contain a transition metal oxide (TMO), such as Nickel Oxide (NiO). The ADC may include an interconnect circuit that is operable to couple a power supply to the CEM devices. The power supply is controlled to program the resistance of the CEM devices and thereby control performance characteristics of the ADC.

20 Claims, 5 Drawing Sheets

ANALOG TO DIGITAL CONVERTER USING CORRELATED ELECTRON MATERIAL DEVICES

TECHNICAL FIELD

The present disclosure relates to an analog-to-digital converter circuit that uses Correlated Electron Material (CEM) devices.

BACKGROUND

An analog-to-digital converter (ADC) is an electrical circuit that converts an analog input signal, such as a voltage, into a digital signal. The digital signal may be a single digital number proportional to the magnitude of the voltage or a sequence of such digital numbers.

A successive-approximation analog-to-digital converter uses a comparator to successively narrow a range that contains the input voltage. At each iterative step, the converter compares the input voltage to the output of an internal digital-to-analog converter which might represent the midpoint of a selected voltage range. At each step in this process, the approximation is stored in a successive approximation register (SAR). The internal digital-to-analog converter may use a network of resistors.

Correlated Electron Material (CEM) exhibits a state transition from a low impedance state to a high impedance state. The transition arises from electron correlations in a material, rather than from the solid state structural phase changes seen in other materials. The transition may be controlled by a voltage and current applied across the correlated electron material.

SUMMARY OF THE PRESENT DISCLOSURE

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

DETAILED DESCRIPTION OF THE EMBODIMENTS

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

The present disclosure relates to an analog-to-digital converter (ADC) that includes correlated electron material (CEM) resistive elements.

Figure 1:
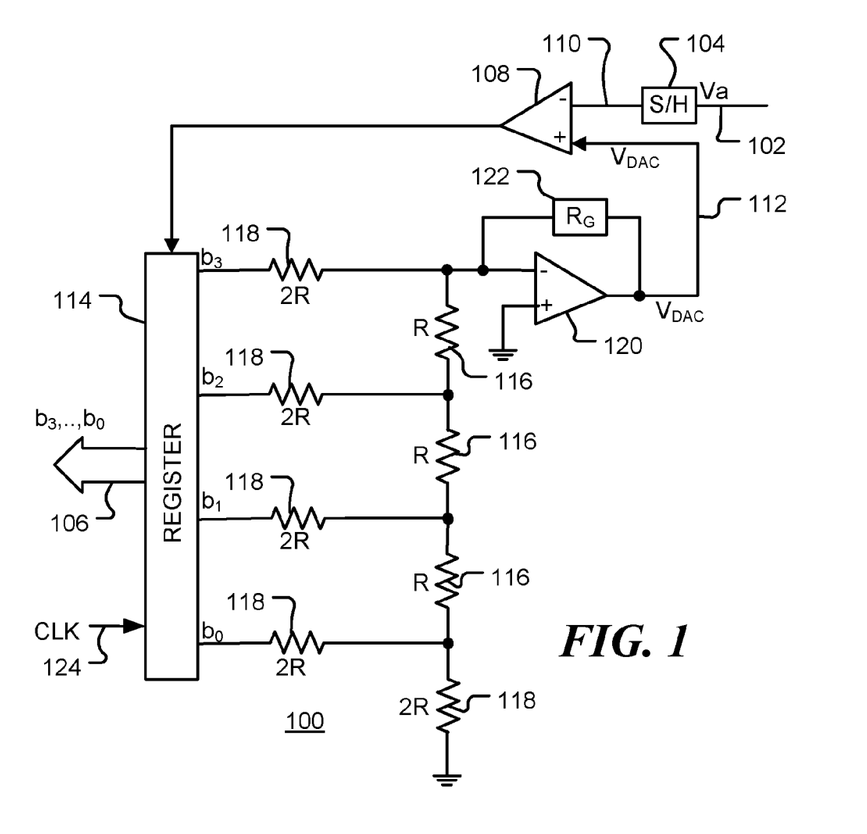
FIG. 1 is a diagram of an analog-to-digital converter (ADC) circuit.

FIG. 1 is a diagram of a conventional analog-to-digital converter (ADC) circuit 100. The circuit 100 converts an analog input signal $V_A$, provided at input 102 to sample and hold unit 104, into a digital code provided at output 106. The analog input signal may be a voltage, for example. The digital code is proportional to the level of the voltage input. The ADC may provide a sequence of digital codes. The digital code will also be referred to as a digital value.

A successive-approximation analog-to-digital converter, as shown, uses comparator 108 to iteratively narrow a range that contains the sampled input voltage 110. At each iteration, the converter compares the sampled input voltage 110 to the output 112 of an internal digital-to-analog converter (DAC). At each step in this process, the approximation is stored in a successive approximation register (SAR) 114. FIG. 1 shows a simplified example of a 4-bit converter. The values in register 114 correspond to bits of the converted digital value. These values, denoted as binary values $b_3$, $b_2$, $b_1$, and $b_0$, shown are used to drive a network of resistors with corresponding voltages $b_3 V_{ref}$, $b_2 V_{ref}$, $b_1 V_{ref}$, and $b_0 V_{ref}$, where $V_{ref}$ is a reference voltage. The network includes first resistors 116 having a resistance value R and second resistors 118 having a resistance value 2R. Hence, the network is referred to herein as an 'R-2R' network. The output from the resistor network is provided to an inverting amplifier 120, the gain of which is set by feedback resistor 122 with resistance value $R_G$. The register 114 may be clocked by clock input 124.

Figure 2:
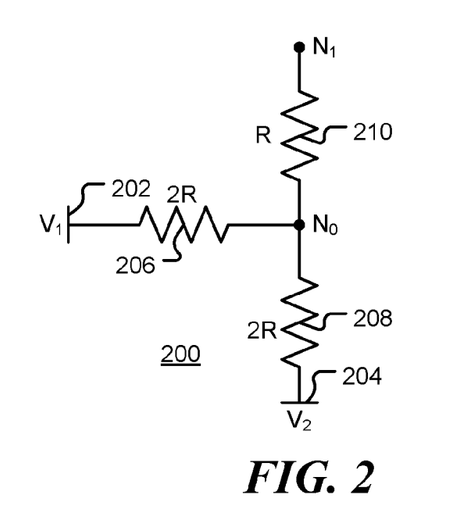
FIG. 2 is a circuit diagram of a resistor network.

FIG. 2 is a circuit diagram of a resistor network. The resistor network forms a basic building block for the ADC circuit shown in FIG. 1. The circuit 200 comprises a first voltage source 202 and a second voltage source 204 coupled together via resistors 206 and 208 with resistance values 2R. Node $N_0$ is coupled to output node $N_1$ via resistor 210 with value R.

Figure 3:
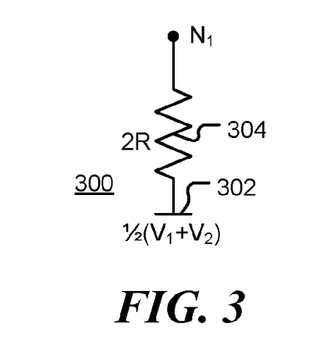
FIG. 3 is a circuit diagram of an equivalent resistor network to that shown in FIG. 2.

FIG. 3 is a circuit diagram showing a circuit 300 that is equivalent to circuit 200 shown in FIG. 2. It will be apparent to those of ordinary skill in the art that circuit 300 is the Thévenin equivalent of circuit 200. Circuit 300 comprises voltage source 302 with value $\frac{1}{2}(V_1+V_2)$ and resistor 304 with resistance value 2R. The circuit shown in FIG. 1 may be analyzed by replacing resistor blocks with their Thévenin equivalent circuits, starting at the block driven by line $b_0$ and working upwards. The complete resistor network is equivalent to circuit structured as circuit 300 but with a resistance value of R and with the voltage source having voltage $$V_{DAC} = \frac{V}{2}\left(b_3 + \frac{1}{2}\left(b_2 + \frac{1}{2}\left(b_1 + \frac{1}{2}(b_0 + 0)\right)\right)\right) = \quad (1)$$
$$\left(\frac{1}{2}b_3 + \frac{1}{4}b_2 + \frac{1}{8}b_1 + \frac{1}{16}b_0\right)V_{ref},$$

where $V_{ref}$ is the reference voltage. Thus, selection of the binary values $b_3$, $b_2$, $b_1$, and $b_0$ allows the voltage $V_{DAC}$ to approximate the input voltage. These binary values constitute the digital representation of the input voltage. The resistor network shown in FIG. 1 may be extended to include additional bits so as to enable more accurate digital representations.

In accordance with an aspect of the disclosure, an analog-to-digital converter is provided that uses programmable resistive devices. A resistance value of a programmable resistive device may change due to a state transition or a solid state structural phase change. For example, a phase change memory (PCM) device undergoes a crystalline/amorphous phase change, and a resistive RAM devices exhibits filamentary formation and conduction in resistive RAM devices.

In accordance with an aspect of the disclosure, an analog-to-digital converter is provided that uses Correlated Electron Material (CEM) devices. A Correlated Electron Material (CEM) may exhibit an abrupt state transition between conductor and insulator, arising from electron correlations rather than from solid state structural phase changes (such as the crystalline/amorphous phase change in phase change memory (PCM) devices or filamentary formation and conduction in resistive RAM devices). In one aspect, an abrupt conductor/insulator state transition in a CEM may be responsive to a quantum mechanical phenomenon, in contrast to melting/solidification or filament formation.

A CEM element is born in a low impedance state, that is, the doping of the transition-metal oxide (TMO) creates both electrons and holes. However, the doping is still p-type (defined by moving the Fermi level down in energy). The electrons are well screened in that there is no band-splitting, but are well above this new Fermi level. Therefore, the electrons do not contribute to transport. In the initial state, there is a large surplus of electrons in the CEM which do not contribute to current. When a bias potential is applied, hole injection occurs causing a hole current. When sufficient bias is applied (greater than the band-splitting potential) a Mott transition occurs. The transition occurs when the number of injected holes equals the number of electrons trapped in the system. The CEM switches from a metal state to the insulator state via the Mott transition. At this point, the electrons are no longer screened and become localized, this correlation splits the bands causing the material to have a very high resistance. In this state, transport is still via holes. If enough bias is applied, electrons are injected. When enough electrons have been injected and enough potential is applied to overcome the set potential criteria, the increase in electrons screens the electrons and removes the localization—collapsing the band-splitting potential and forming a metal or low resistance material. The electrons injection into the system is controlled by the compliance of the system. The compliance therefore sets the number of electrons in the system that need to be "captured" by holes for the Mott transition to occur.

Correlated electron materials may be used in memory devices and switches. The impedance state of a CEM element may be used to designate a stored data value, which may be read in a variety of ways. Data may be written to a CEM memory device using a variety of methods examples of which can be are described in commonly-owned U.S. patent application Ser. No. 14/826,064, titled "Programmable Voltage For Correlated Electron Switch" and/or commonly-owned U.S. patent application Ser. No. 14/826,091, titled "Programmable Current For Correlated Electron Switch" which are incorporated herein by reference.

Figure 4:
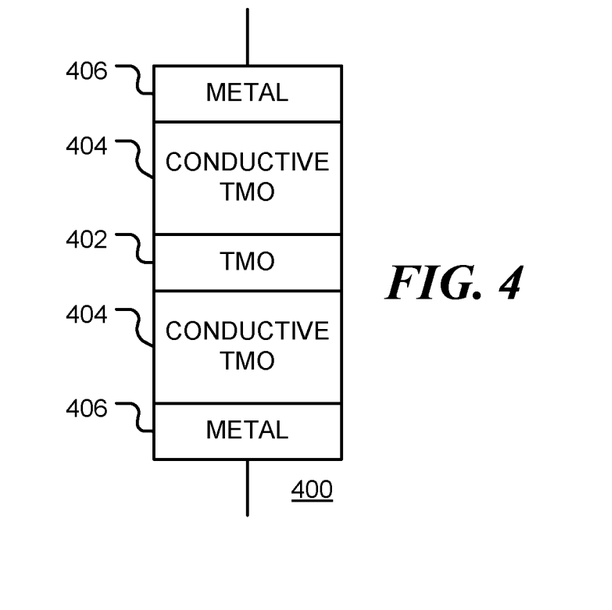
FIG. 4 is a diagrammatic representation of a Correlated Electron Material (CEM) element, in accordance with embodiments of the disclosure.

FIG. 4 is a diagrammatic representation of a Correlated Electron Material (CEM) element 400, in accordance with embodiments of the disclosure. The CEM element 400 includes correlated electron material (CEM) 402. The CEM may be a transition metal oxide (TMO) material, such as Nickel Oxide (NiO) for example. The CEM is able to transition between two states—a high impedance state, in which metal ions capture and localize all of the electrons in the material, and a low impedance state in which electrons are not localized and the material behaves as a metal. In this embodiment, the CEM 402 is located between TMO conductors 404 and metal terminals 406.

State transitions in the CEM only occur when both voltage and current levels exceed certain thresholds. When the current threshold is not exceed the CEM, once placed into a high impedance state, remains in a high impedance state, even when subject to a high voltage electrostatic discharge, for example.

Figure 5:
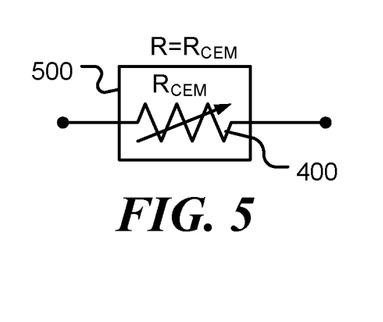
FIG. 5 is a diagrammatic representation of a CEM device using a single Correlated Electron Material (CEM) element, in accordance with embodiments of the disclosure.

FIG. 5 is a diagrammatic representation of a CEM device 500 using a single CEM element 400, in accordance with embodiments of the disclosure. The resistance value R of the device 500 equals the value $R_{CEM}$ of the resistive component of the impedance of the CEM element 400. It is noted that the impedance of CEM device 500 may have reactive component, such as a capacitance, in addition to its resistance component. Both the resistance and capacitance of the CEM element may be higher in the high impedance state than in the low impedance state.

Figure 6:
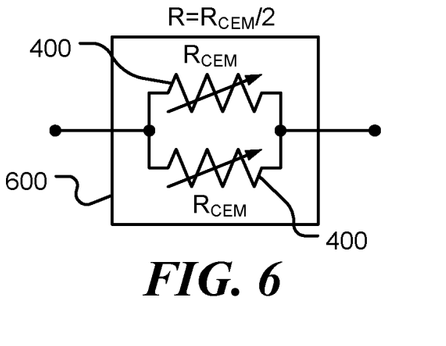
FIG. 6 is a diagrammatic representation of a CEM device using two Correlated Electron Material (CEM) elements coupled in parallel, in accordance with embodiments of the disclosure.

FIG. 6 is a diagrammatic representation of a CEM device 600 using two CEM elements 400 coupled in parallel, in accordance with embodiments of the disclosure. The resistance value R of the CEM device 600 equals $R_{CEM}/2$, that is, one half of the resistance value of a CEM element.

In a similar manner, multiple CEM elements may be coupled together to form a single CEM device. An advantage of coupling two or more CEM elements together is that manufacturing variations in the impedance values of the individual elements are averaged across the device, yielding a lower overall variation.

Figure 7:
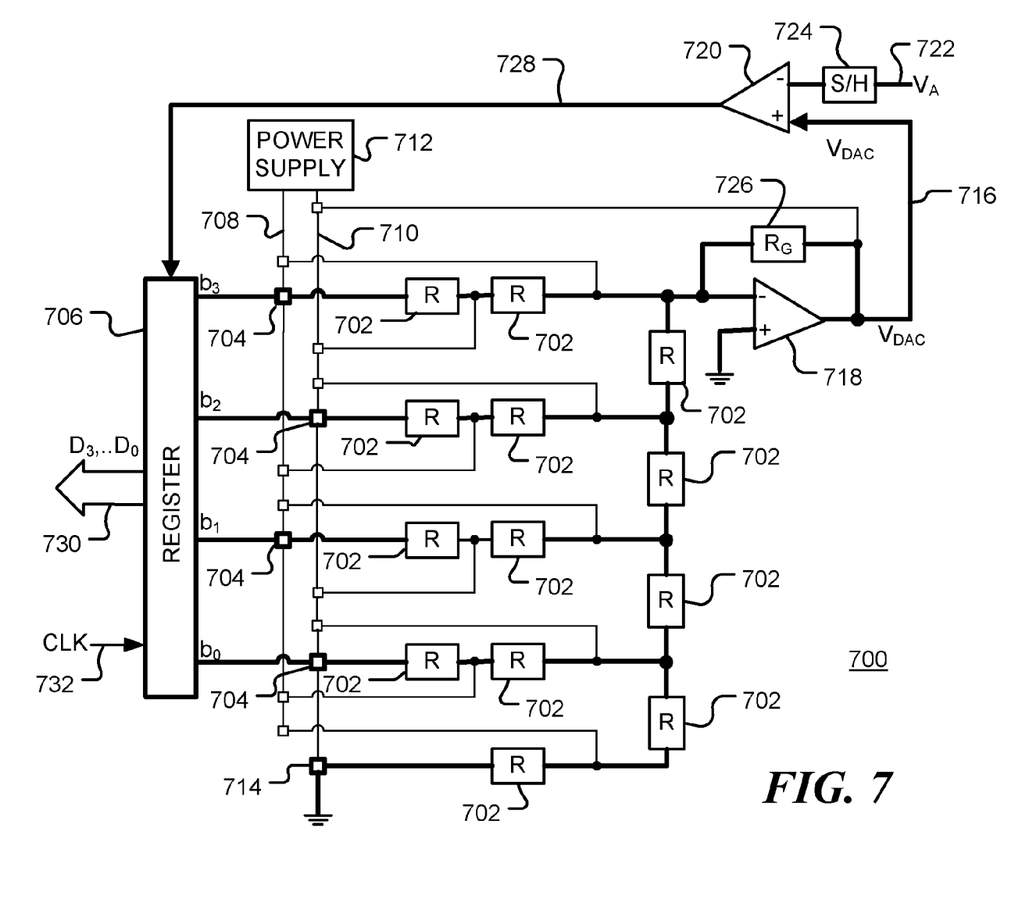
FIG. 7 is a diagram of an ADC circuit using Correlated Electron Material (CEM) devices, in accordance with embodiments of the disclosure.

FIG. 7 is a diagram of an ADC circuit 700 using Correlated Electron Material (CEM) devices 702, in accordance with embodiments of the disclosure. The ADC circuit 700 includes a network of CEM devices 702, a plurality of bit lines $b_0$-$b_3$, a register 706 coupled to the bit lines and operable to control the bits lines dependent upon a digital value stored in the register, a programming power supply. An interconnect circuit, which includes routing switches 704, is operable in a first operating mode to couple the bit lines to the network of CEM devices 702 and operable in a second operating mode to couple the programming power supply 712 to one or more CEM devices of network of CEM devices. Comparator 720 is used in the first operating mode to compare an analog input signal 722 to a signal 716 output from the network of CEM device. In the first operating mode, the digital value is adjusted dependent upon an output from the comparator. In the second operating mode, the programming power supply is controlled to program the CEM devices to a selected state of a high impedance state and a low impedance state. The adjusted digital value provides a digital representation of the analog input signal.

In a further embodiment, devices 702 may comprise other elements having a programmable or switchable resistance.

ADC circuit 700 includes a R-2R network of CEM devices, where the 'R' elements are provided by a CEM device and the '2R' elements are provided by a series combination of two CEM devices. When used for converting analog signal levels to digital values, circuit 700 operates in a similar manner to circuit 100 shown in FIG. 1, but with several distinct advantages.

Firstly, when the CEM elements are in a high impedance state, the CEM devices 702 have a very high resistance (~10 MΩ in one embodiment). Consequently the circuit 700 will consume very little electrical power. This is especially beneficial for use in battery powered devices, where power consumption is to be minimized.

Secondly, the resistivity of CEM elements has lower manufacturing variability and lower temperature sensitivity compared to other types of resistors. This results in more accurate digital values.

Thirdly, the area of a CEM device is much less than the area of a resistor formed by other techniques. This results in a much smaller ADC, since in a typical conventional ADC the resistor network may be 80% of the surface area or more.

Fourthly, a CEM device may be switched from a very high impedance state to a lower impedance state, where the resistance and capacitance in the lower impedance state may be controlled by the electrical current applied during the transition process. A lower resistance, while consuming more electrical power, may provide a faster conversion, since the resistance of the circuit combines with stray capacitance of the circuit and the capacitance of the device itself, resulting in an RC time constant that is lower for lower resistance values. An ADC with switchable resistance values enables a user or designed to select between faster conversion or lower power consumption.

Referring to FIG. 7, when used in a first operating mode for converting analog signal levels to digital values, circuit 700 operates in a similar manner to circuit 100 shown in FIG. 1. The square markers at line junctions denote routing switches that may be controlled to connect or disconnect any of the joining lines. In a conversion mode, routing switches 704 are controlled to couple the bit lines $b_3$, $b_2$, $b_1$, and $b_0$ from register 706 to the adjacent CEM devices 702. Routing switches 704 also disconnect the bit lines from power supply lines 708 and 710 of power supply 712. Routing switch 714 is controlled to couple the lowest CEM element 702 to ground. The other routing switches are controlled to disconnect the joining lines from the power supply 712 and from each other. The resulting electrical circuit is indicated in FIG. 7 by the bold lines. It will be apparent to those of ordinary skill in the art that the circuit indicated by the bold lines can operate in a similar manner to the circuit shown in FIG. 1. Namely, the signals on bit lines $b_3$, $b_2$, $b_1$, and $b_0$ may be controlled such that the level of output 716 from amplifier 718 is compared in comparator 720 to a sampled value of the input voltage 722 held in sample and hold unit 724. The amplifier gain is set by CEM device 726, which functions as a feedback resistor. Comparator output 728 is supplied to register 706 to enable selection of the digital values used to drive bit lines $b_1$, $b_2$, $b_1$, and $b_0$. Once the digital values have been determined (by a binary search of levels, for example), the digital output is provided at 730. The ADC may be clocked by clock signal 732.

In order to program the CEM devices 702, a program voltage is applied across each CEM element. Since each CEM device 702 includes a single CEM element or two or more CEM elements coupled in parallel, the program voltage may be applied across the terminals of the CEM device.

Figure 8:
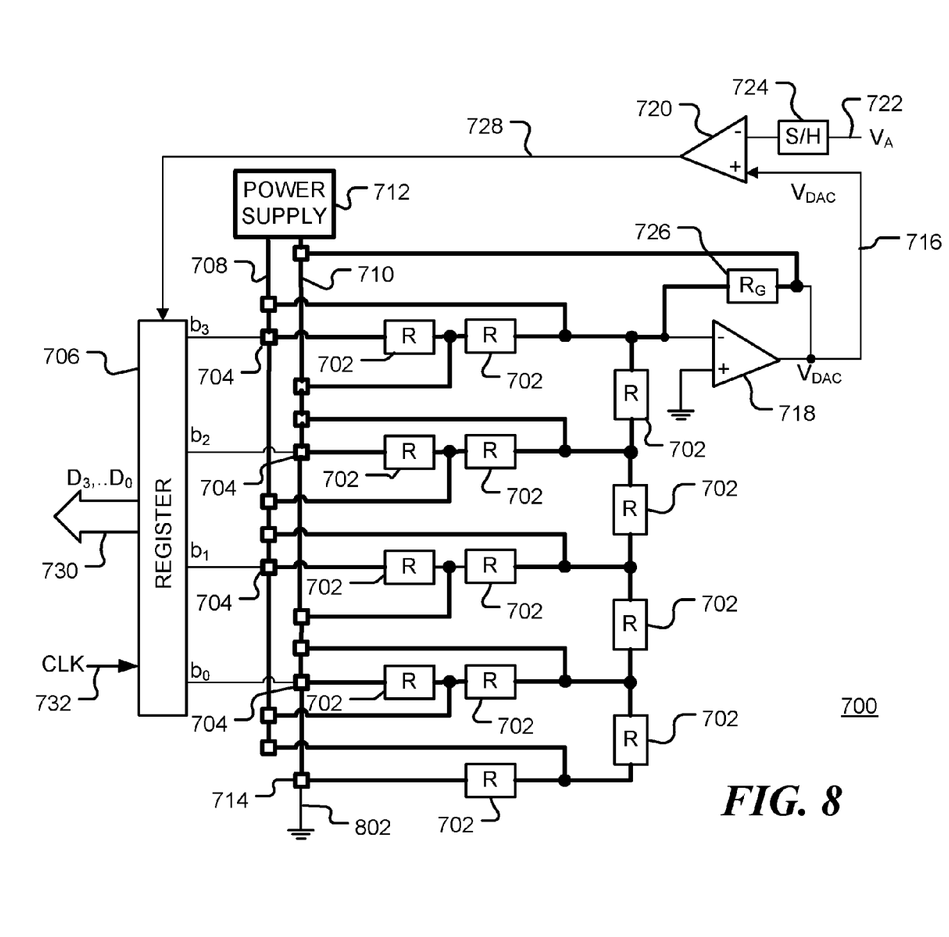
FIG. 8 is a further diagram of an ADC circuit using Correlated Electron Material (CEM) devices, in accordance with embodiments of the disclosure.

FIG. 8 is a further diagram of an ADC circuit using Correlated Electron Material devices, in accordance with embodiments of the disclosure. In FIG. 8, the ADC circuit is configured for a second operating mode and the routing switches denoted by the square boxes at line junctions are controlled to couple power supply 712 to each of the CEM devices 702, and the CEM device 726. Routing switches 704 are controlled to disconnect the bit lines from register 706. The resulting electrical circuit is denoted by the bold lines in FIG. 8. Each element 702 is coupled at one terminal to line 708 from power supply 712 and is coupled at the other terminal to line 710 from power supply 712. In a first embodiment, line 710 is coupled to an electrical ground. This may be achieved by controlling routing switch 714 to couple to ground 802, for example. Power line 708 is coupled to a voltage supply with voltage level $V_{pp}$, where $V_{pp}$ is a programming voltage for the CEM devices. In a second embodiment, routing switch 714 control to decouple from ground 802 and power line 710 is coupled to a negative voltage such as negative charge pump in power supply 712. A positive voltage, such the normal supply voltage $V_{dd}$, is applied to power line 708. In this way and voltage differential greater than the supply voltage $V_{dd}$, is applied across each CEM device 702.

Power supply 712 controls both the voltage across the CEM resistive elements 702 and the current flow through them. Thus, the CEM elements may be switched from a high resistance to a low impedance state or from a low impedance state to a high impedance state. The resistance value in the low impedance state may be controlled by controlling the current.

The CEM devices may be programmed together, in groups, or separately.

Other, equivalent, programming circuits will be apparent to those of ordinary skill in the art.

Figure 9:
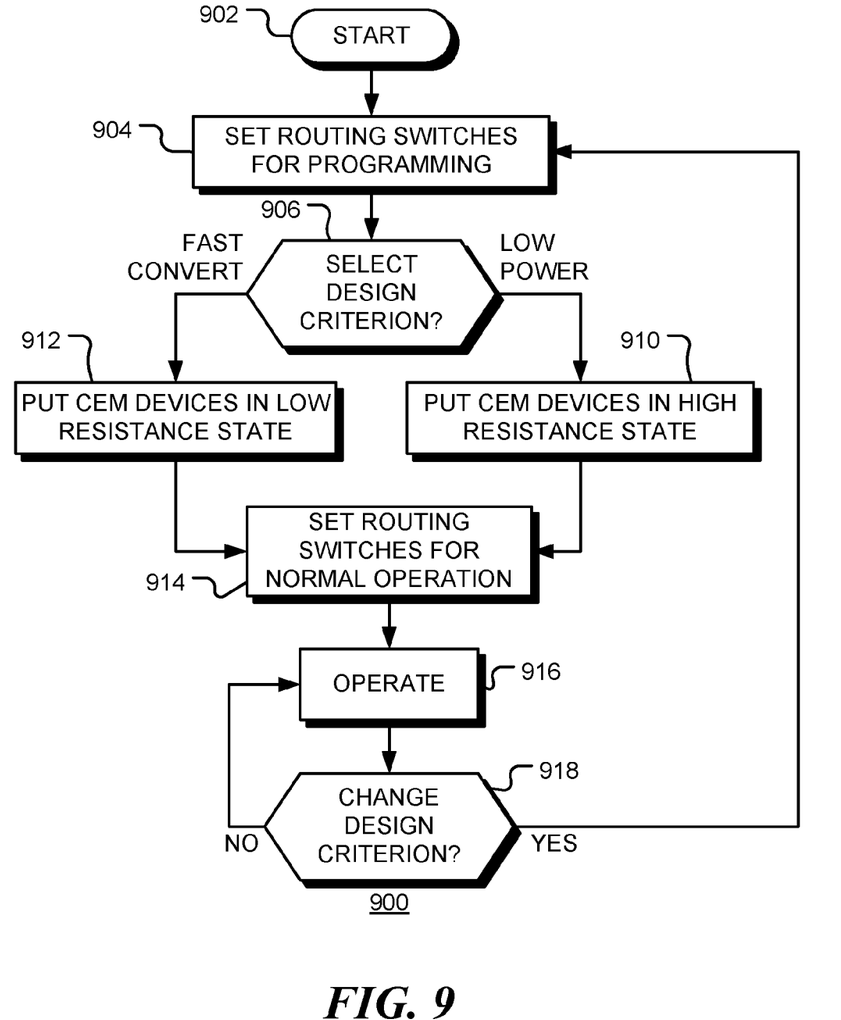
FIG. 9 is a flow chart of a method of operation of an ADC circuit that uses Correlated Electron Material (CEM) devices, in accordance with embodiments of the disclosure.

FIG. 9 is a flow chart of a method 900 of operation of an ADC circuit that uses Correlated Electron Material devices, in accordance with embodiments of the disclosure. Following start block 902, which may denote an initial operation of the ADC circuit, the routing switches of the ADC circuit are set to enable programming of the CEM devices, as depicted in FIG. 8, for example. The routing switches may be transistors, for example. At decision block 906 it is determined if the CEM devices are to be programmed lower power consumption or faster conversion. If an ADC with lower power consumption is desired, flow continues to block 910 and the CEM devices are programmed for a high impedance state by apply a program voltage across each CEM device. If an ADC with shorter conversion time is desired, flow continues to block 912 and the CEM devices are programmed for a low impedance state by apply a program voltage across each CEM device. The programmed resistance in the low impedance state is determined by the compliance current through the CEM device and may be selected to meet given performance criteria. The CEM devices are now programmed and will remain programmed even when no power is supplied to the ADC. At block 914, the routing switches are set for normal operation of the ADC, as depicted in FIG. 7, for example. The programming power supply is disconnected. Normal operation occurs at block 916, during which one or more samples of the analog input signal are converted to digital values for use by digital signal processor or other computer, for storage, or for transmission to another location. If a change is desired to the selected design criterion, as depicted by the positive branch from decision block 918, flow returns to block 904 and the CEM devices are reprogrammed. Otherwise, as depicted by the negative branch from decision block 918, flow continues to block 916 to continue normal operation.

The integrated circuits disclosed above may be defined be a set of instructions of a Hardware Description Language (HDL). The instructions may be stored in a non-transient computer readable medium. The instructions may be distributed via the computer readable medium or via other means such as a wired or wireless network. The instructions may be used to control manufacture or design of the integrated circuit, and may be combined with other instructions.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So for example performing X includes any suitable method for causing another party such as a remote user, a remote processing resource (e.g., a server or cloud computer) or a machine to perform X. Similarly, performing elements X, Y, and Z may include any method of directing or controlling any combination of such other individuals or resources to perform element X, Y, and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some features of the disclosed embodiments are set out in the following numbered items:

1. An analog-to-digital converter (ADC) comprising:
    a network of correlated electron material (CEM) devices;
    a plurality of bit lines;
    a register coupled to the plurality of bit lines and operable to control the plurality of bits lines dependent upon a digital value stored in the register;
    an interconnect circuit operable in a first operating mode to couple the plurality of bit lines to the network of CEM devices; and
    a comparator configured in the first operating mode to compare an analog input signal to a signal output from the network of CEM devices;
    where, in the first operating mode, the digital value is adjusted dependent upon an output from the comparator; and
    where the adjusted digital value comprises a digital representation of the analog input signal.
2. The ADC of item 1, where a CEM device of the plurality of CEM devices comprises one or more CEM elements.
3. The ADC of item 2, where a CEM element of the one or more CEM elements comprises a transition metal oxide.
4. The ADC of item 1, further comprising:
    a programming power supply;
    where the interconnect circuit is operable in a second operating mode to couple the programming power supply to one or more CEM devices of the network of CEM devices; and
    where, in the second operating mode, the programming power supply is controlled to program the CEM devices to a selected state of a high impedance state and a low impedance state.
5. The ADC of item 4, where the programming power supply, in the second mode of operation, is configured to cause a Mott transition in the CEM element.
6. The ADC of item 4, where the programming power supply comprises a positive voltage source and a negative voltage source.
7. The ADC of item 1, where the network of CEM devices are coupled in an R-2R configuration in which the 2R elements comprise two CEM device coupled in series.
8. The ADC of item 1, where a CEM device of the plurality of CEM devices comprises two or more CEM elements coupled in a parallel arrangement.
9. The ADC of item 1, further comprising an amplifier, coupled between an output of the network of CEM devices and the comparator and configured to amplify the signal output from the network of CEM devices.
10. The ADC of item 9, where a feedback resistor of the amplifier comprises at least one CEM element.
11. The ADC of item 1, where the interconnect circuit comprises a plurality of routing switches.
12. The ADC of item 1, where the plurality of CEM devices are programmed to have the same resistance value.
13. The ADC of item 1, further comprising a sample and hold unit, where the analog input signal comprises a sampled analog signal held in the sample and hold unit.
14. A method of operation of an analog-to-digital converter to provide a digital representation of an analog input voltage, the method comprising:
    coupling a power supply to one or more correlated electron material (CEM) devices in a network of CEM devices;
    controlling the power supply to program the one or more CEM devices to a first resistive state of a high resistive state and a low resistive state;
    coupling a plurality of bit lines to the network of CEM devices;
    supplying voltages to the plurality of bits lines, the voltages dependent upon bits of a digital value stored in a register; and
    adjusting the digital value such that a voltage output from the network of device approximates an analog input voltage,
    where the digital representation comprises the adjusted digital value.
15. The method of item 14 where adjusting the digital value such that the voltage output from the network of device approximates the analog input voltage comprises performing a successive approximation using a binary search of digital values.
16. The method of item 14, where controlling the power supply to program the one or more CEM devices to the first resistive state of a high resistive state and a low resistive state comprises controlling a voltage across the one or more CEM devices and controlling a current through the one or more CEM devices cause Mott transitions in CEM elements of the CEM devices.
17. An analog-to-digital converter (ADC) comprising:
    a network of programmable devices;
    a plurality of bit lines;

a register coupled to the plurality of bit lines and operable to control the plurality of bits lines dependent upon a digital value stored in the register;

an interconnect circuit operable in a first operating mode to couple the plurality of bit lines to the network of programmable devices; and a comparator configured in the first operating mode to compare an analog input signal to a signal output from the network of programming devices;

where, in the first operating mode, the digital value is adjusted dependent upon an output from the comparator; and where the adjusted digital value comprises a digital representation of the analog input signal.

18. The ADC of item 17, where a programmable device of the plurality of programmable devices comprises one or more correlated element material (CEM) elements.

19. The ADC of item 17, further comprising:

a programming power supply;

where the interconnect circuit is operable in a second operating mode to couple the programming power supply to one or more programmable devices of the network of programmable devices; and where, in the second operating mode, the programming power supply is controlled to program the programmable devices to a selected state of a high resistance state and a low resistance state.

What is claimed is:

1. An analog-to-digital converter (ADC) comprising:
a network of correlated electron material (CEM) devices, the CEM devices comprising transition metal oxide (TMO) material programmable between a conductor state having a low impedance and an insulator state having a high impedance;
a plurality of bit lines;
a register coupled to the plurality of bit lines and operable to control the plurality of bits lines dependent upon a digital value stored in the register;
an interconnect circuit operable in a first operating mode to couple the plurality of bit lines to the network of CEM devices; and
a comparator configured in the first operating mode to compare an analog input signal to a signal output from the network of CEM devices;
where, in the first operating mode, the digital value is adjusted dependent upon an output from the comparator; and
where the adjusted digital value comprises a digital representation of the analog input signal.

2. The ADC of claim 1, where a CEM device of the plurality of CEM devices comprises one or more CEM elements.

3. The ADC of claim 2, where a CEM element of the one or more CEM elements comprises oxide Nickel Oxide (NiO).

4. The ADC of claim 1, further comprising:
a programming power supply;
where the interconnect circuit is operable in a second operating mode to couple the programming power supply to one or more CEM devices of the network of CEM devices; and
where, in the second operating mode, the programming power supply is controlled to program the CEM devices to a selected state of the insulator state having the high impedance state and the conductor state having the low impedance state.

5. The ADC of claim 4, where the programming power supply, in the second mode of operation, is configured to cause the correlated electron material in the CEM element to transition between a metallic state and the insulator state.

6. The ADC of claim 4, where the programming power supply comprises a positive voltage source and a negative voltage source.

7. The ADC of claim 1, where the network of CEM devices are coupled in an R-2R configuration in which the 2R elements comprise two CEM device coupled in series.

8. The ADC of claim 1, where a CEM device of the plurality of CEM devices comprises two or more CEM elements coupled in a parallel arrangement.

9. The ADC of claim 1, further comprising an amplifier, coupled between an output of the network of CEM devices and the comparator and configured to amplify the signal output from the network of CEM devices.

10. The ADC of claim 9, where a feedback resistor of the amplifier comprises at least one CEM element.

11. The ADC of claim 1, where the interconnect circuit comprises a plurality of routing switches.

12. The ADC of claim 1, where the plurality of CEM devices are programmed to have the same resistance value.

13. The ADC of claim 1, further comprising a sample and hold unit, where the analog input signal comprises a sampled analog signal held in the sample and hold unit.

14. A method of operation of an analog-to-digital converter to provide a digital representation of an analog input voltage, the method comprising:
coupling a power supply to one or more correlated electron material (CEM) devices in a network of CEM devices, the CEM devices comprising transition metal oxide (TMO) material programmable between a conductor state having a low impedance and an insulator state having a high impedance;
controlling the power supply to program the one or more CEM devices to a first state of the conductor state and the insulator state;
coupling a plurality of bit lines to the network of CEM devices;
supplying voltages to the plurality of bits lines, the voltages dependent upon bits of a digital value stored in a register; and
adjusting the digital value such that a voltage output from the network of device approximates an analog input voltage,
where the digital representation comprises the adjusted digital value.

15. The method of claim 14 where adjusting the digital value such that the voltage output from the network of device approximates the analog input voltage comprises performing a successive approximation using a binary search of digital values.

16. The method of claim 14, where controlling the power supply to program the one or more CEM devices to the first state of the conductor state and the insulator state comprises controlling a voltage across the one or more CEM devices and controlling a current through the one or more CEM devices cause the correlated electron material in CEM elements of the CEM devices to transition between a metallic state and the insulation state.

17. An analog-to-digital converter (ADC) comprising:
a network of programmable devices, programmable between a high impedance state and a low impedance state;
a plurality of bit lines;
a register coupled to the plurality of bit lines and operable to control the plurality of bits lines dependent upon a digital value stored in the register;

an interconnect circuit operable in a first operating mode to couple the plurality of bit lines to the network of programmable devices;

a comparator configured in the first operating mode to compare an analog input signal to a signal output from the network of programming devices; and a programming power supply;

where the interconnect circuit is operable in a second operating mode to couple the programming power supply to one or more programmable devices of the network of programmable devices;

where, in the first operating mode, the digital value is adjusted dependent upon an output from the comparator;

where, in the second operating mode, the programming power supply is controlled to program the programmable devices to a selected state of the high impedance state and the low impedance state; and where the adjusted digital value comprises a digital representation of the analog input signal.

18. The ADC of claim 17, where a programmable device of the plurality of programmable devices comprises one or more correlated element material (CEM) elements, the CEM elements comprising transition metal oxide (TMO) material.

19. The ADC of claim 17, where a device of the network of programmable devices comprises two or more correlated electron material (CEM) elements coupled in a parallel arrangement, the CEM elements comprising transition metal oxide (TMO) material programmable between a conductor state having a low impedance and an insulator state having a high impedance.

20. The ADC of claim 1, where the transition metal oxide comprises Nickel Oxide (NiO).

\* \* \* \* \*